(12) United States Patent
Radovanov et al.

(10) Patent No.: US 7,675,047 B2
(45) Date of Patent: Mar. 9, 2010

(54) TECHNIQUE FOR SHAPING A RIBBON-SHAPED ION BEAM

(75) Inventors: Svetlana B. Radovanov, Marblehead, MA (US); Peter L. Kellerman, Essex, MA (US); Victor M. Benveniste, Gloucester, MA (US); Robert C. Lindberg, Rockport, MA (US); Kenneth H. Purser, Lexington, MA (US); Tyler B. Rockwell, Wakefield, MA (US); James S. Buff, Brookline, NH (US); Anthony Renau, West Newbury, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 447 days.

(21) Appl. No.: 11/536,992

(22) Filed: Sep. 29, 2006

(65) Prior Publication Data

US 2007/0108390 A1     May 17, 2007

Related U.S. Application Data

(63) Continuation-in-part of application No. 11/413,570, filed on Apr. 28, 2006, now Pat. No. 7,339,179.

(51) Int. Cl.
*H01J 37/10* (2006.01)
*H01J 37/317* (2006.01)

(52) U.S. Cl. .................................. 250/492.21; 250/398
(58) Field of Classification Search ............. 250/369 R, 250/492.2, 492.21
See application file for complete search history.

(56) References Cited

U.S. PATENT DOCUMENTS

| 5,091,655 | A | | 2/1992 | Dykstra et al. |
| 5,160,846 | A | * | 11/1992 | Ray ........................ 250/492.2 |
| 5,177,366 | A | | 1/1993 | King et al. |
| 5,780,863 | A | * | 7/1998 | Benveniste et al. ..... 250/492.21 |
| 5,932,882 | A | * | 8/1999 | England et al. ........ 250/492.21 |
| 6,242,750 | B1 | * | 6/2001 | Takahashi et al. ...... 250/492.21 |
| 6,777,696 | B1 | * | 8/2004 | Rathmell et al. ....... 250/492.21 |
| 6,777,882 | B2 | * | 8/2004 | Goldberg et al. ....... 315/111.81 |
| 7,087,913 | B2 | | 8/2006 | Goldberg et al. |
| 7,279,687 | B2 | * | 10/2007 | Angel et al. ............ 250/396 R |

* cited by examiner

*Primary Examiner*—Nikita Wells
*Assistant Examiner*—Johnnie L Smith

(57) ABSTRACT

A technique for shaping a ribbon-shaped ion beam is disclosed. In one particular exemplary embodiment, the technique may be realized as an apparatus for shaping a ribbon-shaped ion beam. The apparatus may comprise an electrostatic lens having a substantially rectangular aperture for a ribbon-shaped ion beam to pass through, wherein a plurality of focusing elements are positioned along short edges of the aperture, and wherein each focusing element is separately biased and oriented to shape the ribbon-shaped ion beam.

20 Claims, 15 Drawing Sheets

TECHNIQUE FOR SHAPING A RIBBON-SHAPED ION BEAM

CROSS-REFERENCE TO RELATED APPLICATIONS

This patent application is a continuation-in-part of U.S. patent application Ser. No. 11/413,570, filed Apr. 28, 2006, which claimed priority to U.S. Provisional Patent Application No. 60/736,293, filed Nov. 15, 2005, each of which is hereby incorporated by reference herein in its entirety.

FIELD OF THE DISCLOSURE

The present disclosure relates generally to ion implantation and, more particularly, to a technique for shaping a ribbon-shaped ion beam.

BACKGROUND OF THE DISCLOSURE

Ion implanters are widely used in semiconductor manufacturing to selectively alter conductivity of materials. In a typical ion implanter, ions generated from an ion source are directed through a series of beam-line components which include one or more analyzing magnets and a plurality of electrodes. The analyzing magnets select desired ion species, filter out contaminant species and ions having incorrect energies, also adjusting ion beam quality at a target wafer. Suitably shaped electrodes can be used to modify the energy and the shape of the ion beam.

FIG. 1 shows a known ion implanter 100 which comprises an ion source 102, extraction electrodes 104, a 90° magnet analyzer 106, a first deceleration (D1) stage 108, a 70° magnet analyzer 110, and a second deceleration (D2) stage 112. The D1 and D2 deceleration stages (also known as "deceleration lenses") are each comprised of multiple electrodes with a defined aperture to allow an ion beam to pass therethrough. By applying different combinations of voltage potentials to the multiple electrodes, the D1 and D2 deceleration lenses can manipulate ion energies and cause the ion beam to hit a target wafer at a desired energy.

The above-mentioned D1 or D2 deceleration lenses are typically electrostatic triode (or tetrode) deceleration lenses. FIG. 2 shows a perspective view of a conventional electrostatic triode deceleration lens 200. The electrostatic triode deceleration lens 200 comprises three sets of electrodes: entrance electrodes 202 (also referred to as "terminal electrodes"), suppression electrodes 204 (or "focusing electrodes"), and exit electrodes 206 (also referred to as "ground electrodes" though not necessarily connected to earth ground). A conventional electrostatic tetrode deceleration lens is similar to the electrostatic triode deceleration lens 200, except that a tetrode lens has an additional set of suppression electrodes (or focusing electrodes) between the suppression electrodes 204 and the exit electrodes 206.

In the electrostatic triode deceleration lens 200, each set of electrodes may have a space to allow an ion beam 20 to pass therethrough (e.g., in the +z direction along the beam direction). As shown in FIG. 2, each set of electrodes may include two conductive pieces electrically coupled to each other to share a same voltage potential. Alternatively, each set of electrodes may be a one-piece structure with an aperture for the ion beam 20 to pass therethrough. As such, each set of electrodes are effectively a single electrode having a single voltage potential. For simplicity, each set of electrodes are referred to in singular. That is, the entrance electrodes 202 are referred to as an "entrance electrode 202," the suppression electrodes 204 are referred to as a "suppression electrode 204," and the exit electrodes 206 are referred to as an "exit electrode 206."

In operation, the entrance electrode 202, the suppression electrode 204, and the exit electrode 206 are independently biased such that the energy of the ion beam 20 is manipulated in the following fashion. The ion beam 20 may enter the electrostatic triode deceleration lens 200 through the entrance electrode 202 and may have an initial energy of, for example, 10-20 keV. Ions in the ion beam 20 may be accelerated between the entrance electrode 202 and the suppression electrode 204. Upon reaching the suppression electrode 204, the ion beam 20 may have an energy of, for example, approximately 30 keV or higher. Between the suppression electrode 204 and the exit electrode 206, the ions in the ion beam 20 may be decelerated, typically to an energy that is closer to the one used for ion implantation of a target wafer. Therefore, the ion beam 20 may have an energy of, for example, approximately 3-5 keV or lower when it exits the electrostatic triode deceleration lens 200.

The significant changes in ion energies that take place in the electrostatic triode deceleration lens 200 can have a substantial impact on a shape of the ion beam 20. FIG. 3 shows a top view of the electrostatic triode deceleration lens 200. As is well known, space charge effects are more significant in low-energy ion beams than in high-energy ion beams. Therefore, as the ion beam 20 is accelerated between the entrance electrode 202 and the suppression electrode 204, little change is observed in the shape of the ion beam 20. However, when the ion energy is drastically reduced between the suppression electrode 204 and the exit electrode 206, the ion beam 20 tends to expand in both X and Y dimensions at its edges. As a result, a considerable number of ions may be lost before they reach the target wafer, and the effective dose of the ion beam 20 is reduced.

There have been attempts to reduce the above-described space charge effect in an electrostatic triode lens. In one approach, for example, Pierce geometry, well known to those skilled in the art, is introduced to each electrode in the electrostatic triode deceleration lens. That is, each electrode is bent at its tip to a defined angle such that electric fields inside the electrostatic triode lens are such that they generate focusing forces counteracting the space charge spreading effects at the edge of an ion beam. However, this approach can only achieve a limited success in controlling ion beam shapes. Despite a changed shape, each electrode still remains one conductive piece biased with a single voltage potential. As a result, generation of the focusing forces at the edge of the ion beam is constrained by the overall voltage potential applied to the electrode. In addition, one particular shape of an electrode may be useful for adjustment of only one particular beam shape or the purveyance of the ion beam.

In view of the foregoing, it would be desirable to provide a technique for providing an electrostatic lens which overcomes the above-described inadequacies and shortcomings.

SUMMARY OF THE DISCLOSURE

A technique for shaping a ribbon-shaped ion beam is disclosed. In one particular exemplary embodiment, the technique may be realized as an apparatus for shaping a ribbon-shaped ion beam. The apparatus may comprise an electrostatic lens having a substantially rectangular aperture for a ribbon-shaped ion beam to pass through, wherein a plurality of focusing elements are positioned along short edges of the aperture, and wherein each focusing element is separately biased and oriented to shape the ribbon-shaped ion beam.

In accordance with other aspects of this particular exemplary embodiment, at least one focusing element may have a curved surface that defines a correspondingly shaped equipotential boundary for the ribbon-shaped ion beam. The at least one focusing element may have an elliptical surface.

In accordance with further aspects of this particular exemplary embodiment, at least one focusing element may have a curved edge that defines an equipotential boundary for the ribbon-shaped ion beam.

In accordance with additional aspects of this particular exemplary embodiment, at least one focusing element can be rotated to change a shape of an equipotential boundary for the ribbon-shaped ion beam.

In accordance with a further aspect of this particular exemplary embodiment, the electrostatic lens may further comprise a plurality of electrodes, and a distance between at least one focusing element and at least one of the plurality of electrodes may be adjustable.

In accordance with a still further aspect of this particular exemplary embodiment, a distance between at least one focusing element and the aperture may be adjustable.

In accordance with a yet further aspect of this particular exemplary embodiment, a separation among the plurality of focusing elements may be adjustable.

In accordance with another aspect of this particular exemplary embodiment, the plurality of focusing elements may comprise a pair of focusing elements that form an oval-shaped aperture.

In another particular exemplary embodiment, the technique may be realized as a method for shaping a ribbon-shaped ion beam. The method may comprise providing an electrostatic lens having a substantially rectangular aperture for a ribbon-shaped ion beam to pass through. The method may also comprise positioning a plurality of focusing elements along short edges of the ribbon-shaped ion beam. The method may further comprise biasing and orienting each focusing element separately to shape the ribbon-shaped ion beam.

In accordance with other aspects of this particular exemplary embodiment, at least one focusing element may have a curved surface that defines a correspondingly shaped equipotential boundary for the ribbon-shaped ion beam. The at least one focusing element may have an elliptical surface.

In accordance with further aspects of this particular exemplary embodiment, at least one focusing element may have a curved edge that defines an equipotential boundary for the ribbon-shaped ion beam.

In accordance with additional aspects of this particular exemplary embodiment, the method may further comprise rotating at least one focusing element to change a shape of an equipotential boundary for the ribbon-shaped ion beam.

In accordance with a further aspect of this particular exemplary embodiment, the method may further comprise providing a plurality of electrodes in the electrostatic lens, and adjusting a distance between at least one focusing element and at least one of the plurality of electrodes.

In accordance with a still further aspect of this particular exemplary embodiment, the method may further comprise adjusting a distance between at least one focusing element and the aperture.

In accordance with a yet further aspect of this particular exemplary embodiment, the method may further comprise adjusting a separation among the plurality of focusing elements.

In accordance with another aspect of this particular exemplary embodiment, the plurality of focusing elements may comprise a pair of focusing elements that form an oval-shaped aperture.

In yet another particular exemplary embodiment, the technique may be realized as at least one signal embodied in at least one carrier wave for transmitting a computer program of instructions configured to be readable by at least one processor for instructing the at least one processor to execute a computer process for performing the method as recited above.

In still another particular exemplary embodiment, the technique may be realized as at least one processor readable carrier for storing a computer program of instructions configured to be readable by at least one processor for instructing the at least one processor to execute a computer process for performing the method as recited above.

In another particular exemplary embodiment, the technique may be realized as a method for shaping a ribbon-shaped ion beam. The method may comprise positioning a plurality of focusing elements along short edges of a substantially rectangular aperture in an electrostatic lens. The method may also comprise biasing and orienting each focusing element separately to define shaped equipotential boundaries. The method may further comprise passing a ribbon-shaped ion beam through the aperture.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION OF EXEMPLARY EMBODIMENTS

Embodiments of the present disclosure illustrate an improved type of electrostatic lens that has one or more segmented suppression electrodes. These electrodes may comprise multiple segments that are independently or separately biased with respect to one another thereby providing flexible and effective manipulation of an ion beam's shape as well as its energy.

Figure 4:
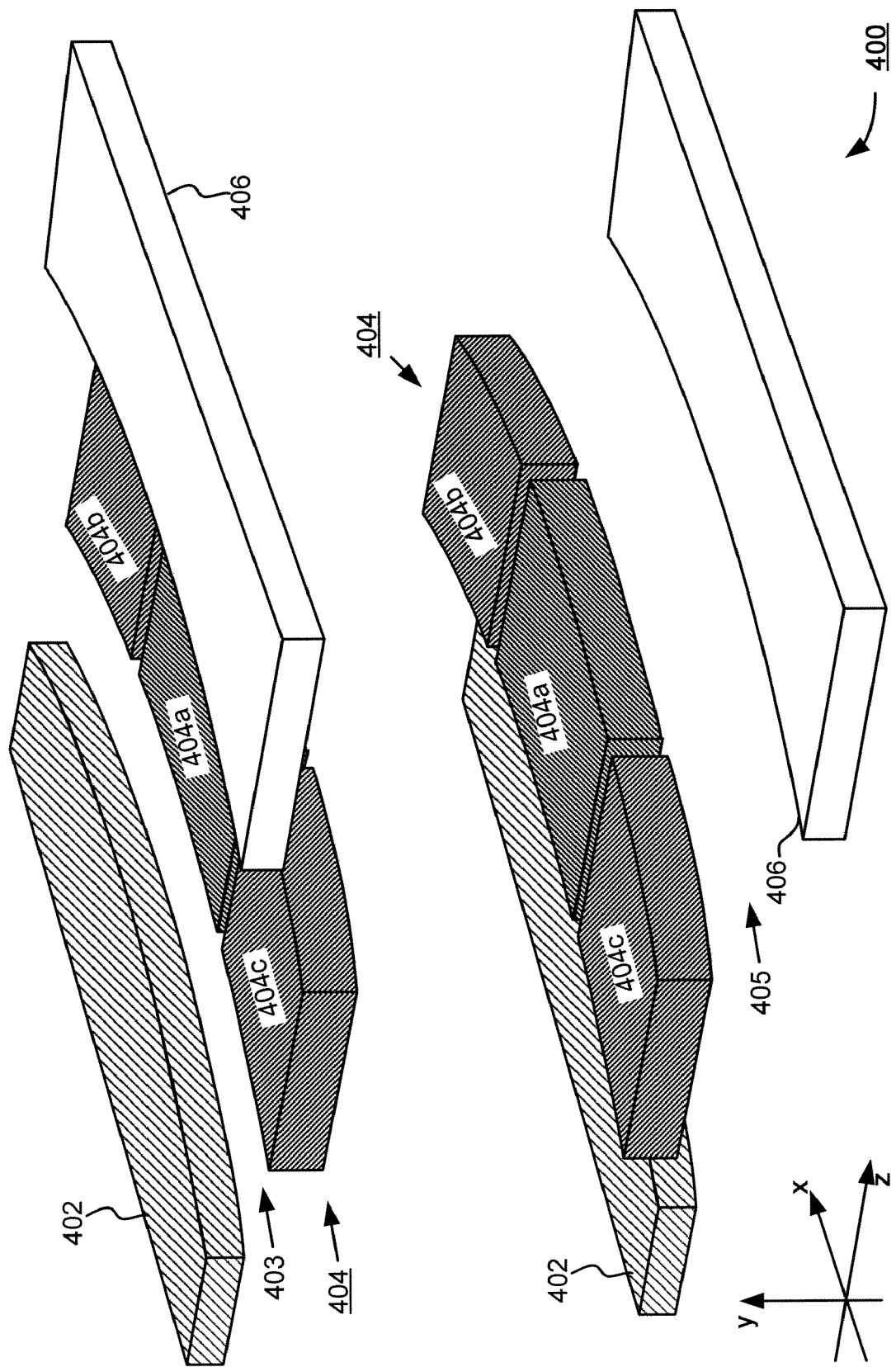
FIG. 4 shows a perspective view of an electrostatic triode lens in accordance with an embodiment of the present disclosure.

Referring to FIG. 4, there is shown a perspective view of an electrostatic lens 400 in accordance with an embodiment of the present disclosure. Somewhat similar to a conventional electrostatic triode lens, the electrostatic lens 400 may comprise an entrance electrode 402 and an exit electrode 406. Instead of a single suppression electrode, however, the electrostatic lens 400 may comprise a plurality of electrodes (collectively referred to as "suppression electrode 404") between the entrance electrode 402 and the exit electrode 406. In other words, what used to be a single suppression electrode may be segmented into multiple electrodes (or segments) that may be independently positioned and biased to create desired electric fields in the electrostatic lens 400. In the exemplary electrostatic lens 400, the suppression electrode 404 is segmented into or comprises three electrodes: a center electrode 404a, and two side electrodes 404b and 404c. The side electrodes 404b and 404c may be symmetrically positioned with respect to the center electrode 404a. Depending on a shape of an incoming ion beam and a desired shape change, gap 403 between the entrance electrode 402 and the suppression electrode 404 may have a contour with defined curvature(s). Similarly, gap 405 between the suppression electrode 404 and the exit electrode 406 may also have a contour with defined curvature(s).

Figure 1:
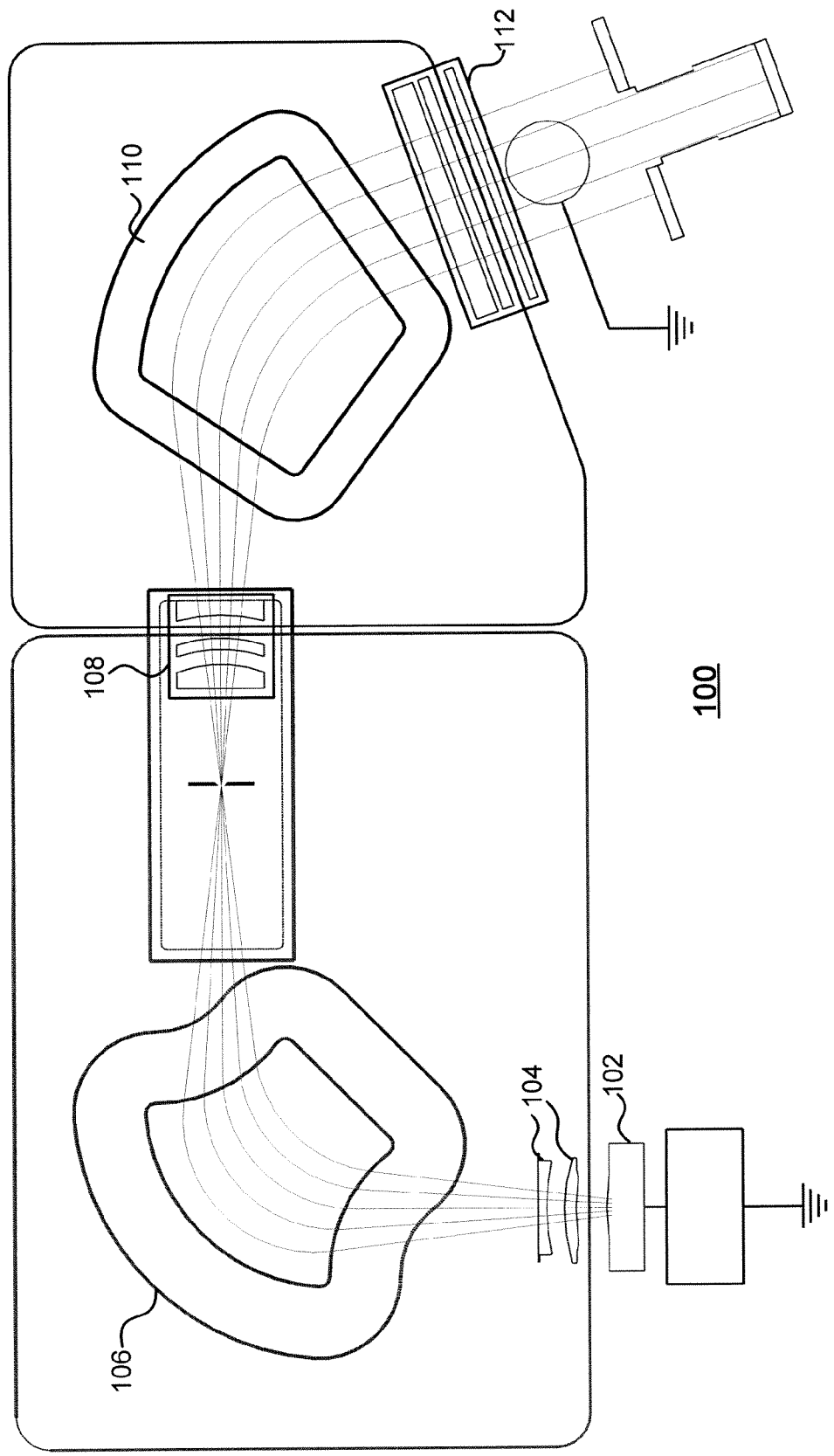
FIG. 1 shows a conventional ion implanter.
Figure 2:
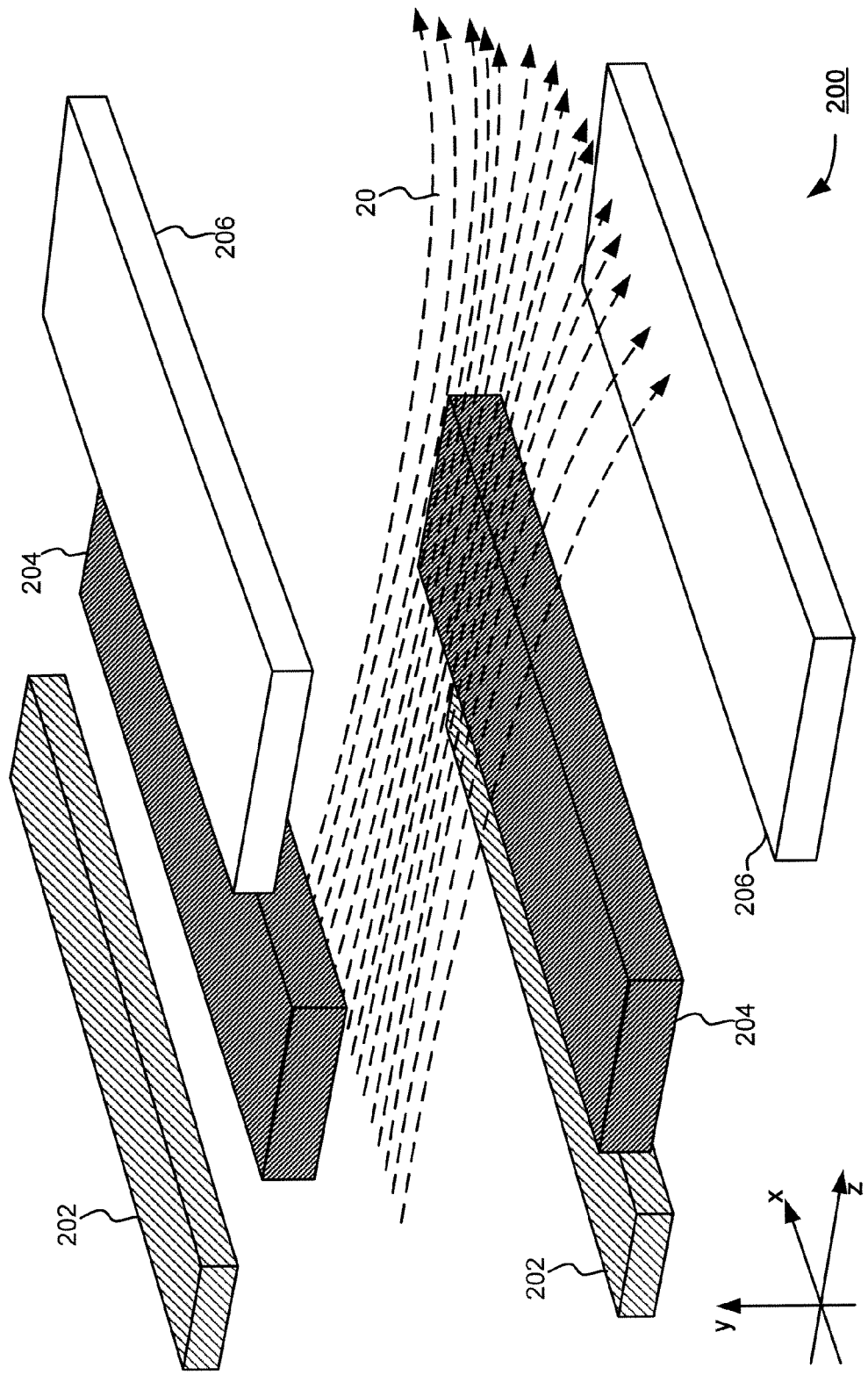
FIGS. 2 and 3 show a conventional electrostatic triode lens and illustrate a problem therein.
Figure 3:
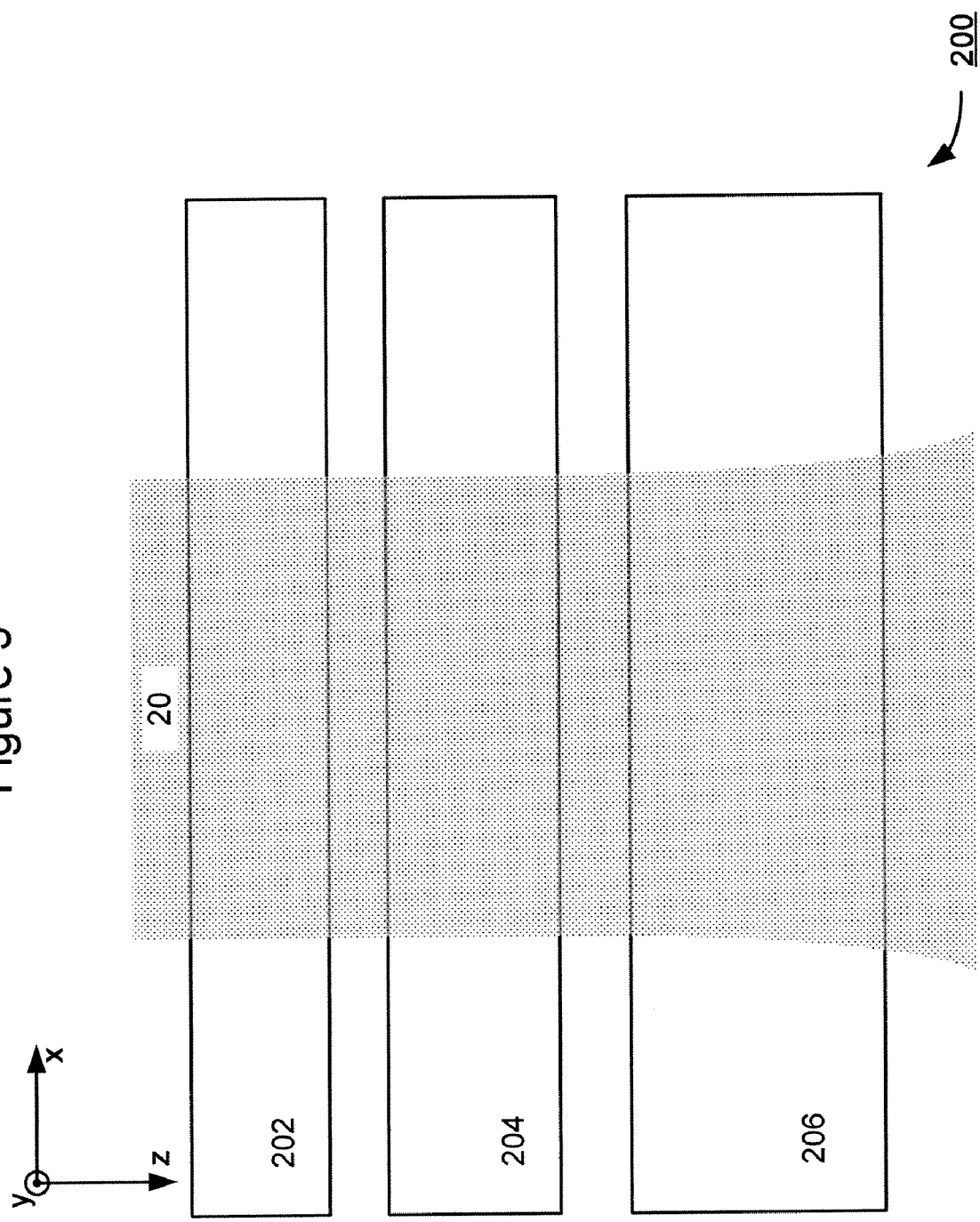
Figure 5:
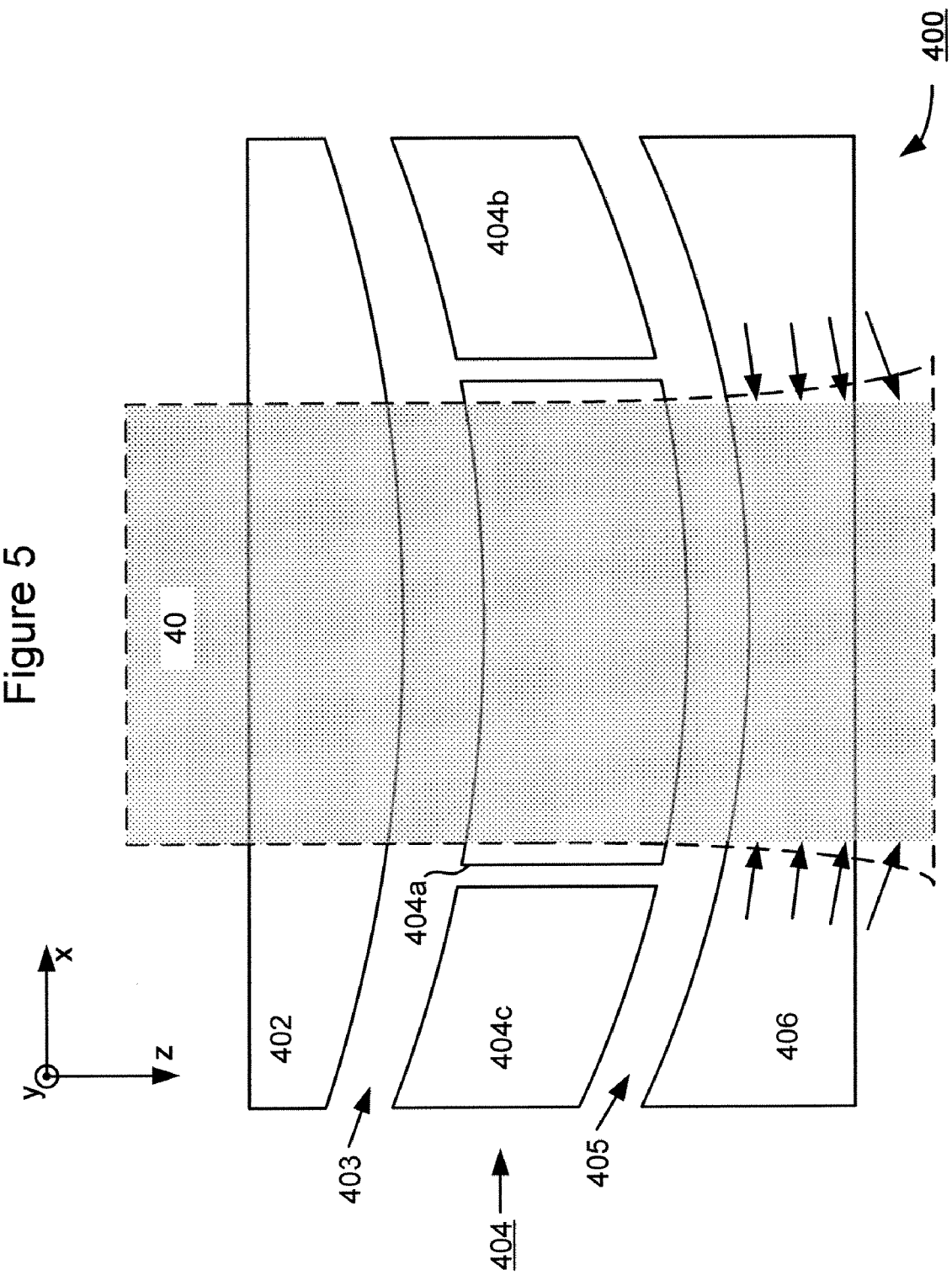
FIG. 5 shows a top view of an electrostatic lens in accordance with an embodiment of the present disclosure.

FIG. 5 shows a top view of the electrostatic lens 400 in accordance with an embodiment of the present disclosure. An ion beam 40 may enter the electrostatic lens 400 through the entrance electrode 402. The ion beam 40 may be a ribbon-shaped ion beam that is wider in an x-direction than its height in a y-direction. The ion beam 40 may have an initial energy of, for example, approximately 10-20 keV. Assuming the ion beam 40 mainly consists of positive ions, the entrance electrode 402 may be biased at a same or similar potential as the incoming ion beam 40, and the center electrode 404a of the segmented suppression electrode 404 may be biased at a much lower potential than the entrance electrode 402. For example, according to one embodiment, the entrance electrode 402 may be biased at 22 kV and the center electrode 404a may be biased at −11 kv. As a result, a strong electric field may be created to accelerate the positive ions as they travel from the entrance electrode 402 towards the suppression electrode 404. The exit electrode 406 may be biased at a potential that is the same as or similar to a potential of a target wafer which receives the ion beam 40. In this embodiment, for example, the exit electrode 406 may be biased at ground potential, which decelerates the ions 40 to an energy of approximately 3-5 keV or lower. In another embodiment, the entrance electrode 402 may be biased at −12 kV, the center electrode 404a of the segmented suppression electrode 404 may be biased at −2 kV, and the exit electrode 406 may be biased at ground potential. As a result, an ion beam 40 with an initial energy of approximately 15 keV may be decelerated to approximately 3 keV upon exiting the deceleration lens 400. In addition, the side electrodes 404b and 404c may be positioned and/or biased independently from the center electrode 404a to provide a desired correction to a shape of the ion beam 40. Depending on the specific usage in an ion implanter (e.g., either as D1 or as D2 deceleration lens shown in FIG. 1), the electrostatic lens 400 may be configured to, for example, adjust a divergence angle of the ion beam 40, or change a width of the ion beam 40, or do both. The side electrodes 404b and 404c may be positioned and biased accordingly. In this embodiment, a main purpose of the electrostatic lens 400 is to reduce the divergence angle for the ion beam 40. Therefore, the side electrodes 404b and 404c are disposed in the same plane as the center electrode 404a and are positioned symmetrically with respect to the center electrode 404a. Both the side electrodes 404b and 404c are biased at −8.5 kV, which creates focusing forces along edges of the ion beam 40 to compensate for a defocusing effect of space charges. As a result, the ion beam 40 may have a small divergence or none at all after being decelerated between the suppression electrode 404 and the exit electrode 406. In addition, curvatures of the electrodes may further tailor electric fields (e.g., in the gaps 403 and 405) to produce focusing or defocusing forces as desired.

It should be noted that, for illustration purposes, the upper and lower pieces in each electrode of the electrostatic lens 400 are treated as sharing a same shape and bias. However, this is only necessary when an ion beam is symmetric or non-diverging in the y-direction. It is contemplated that the electrostatic lens technique described herein may be applied in the y-direction as well as in the x-direction. In addition, either or both suppression electrodes in an electrostatic tetrode lens may be segmented as described herein.

Figure 6:
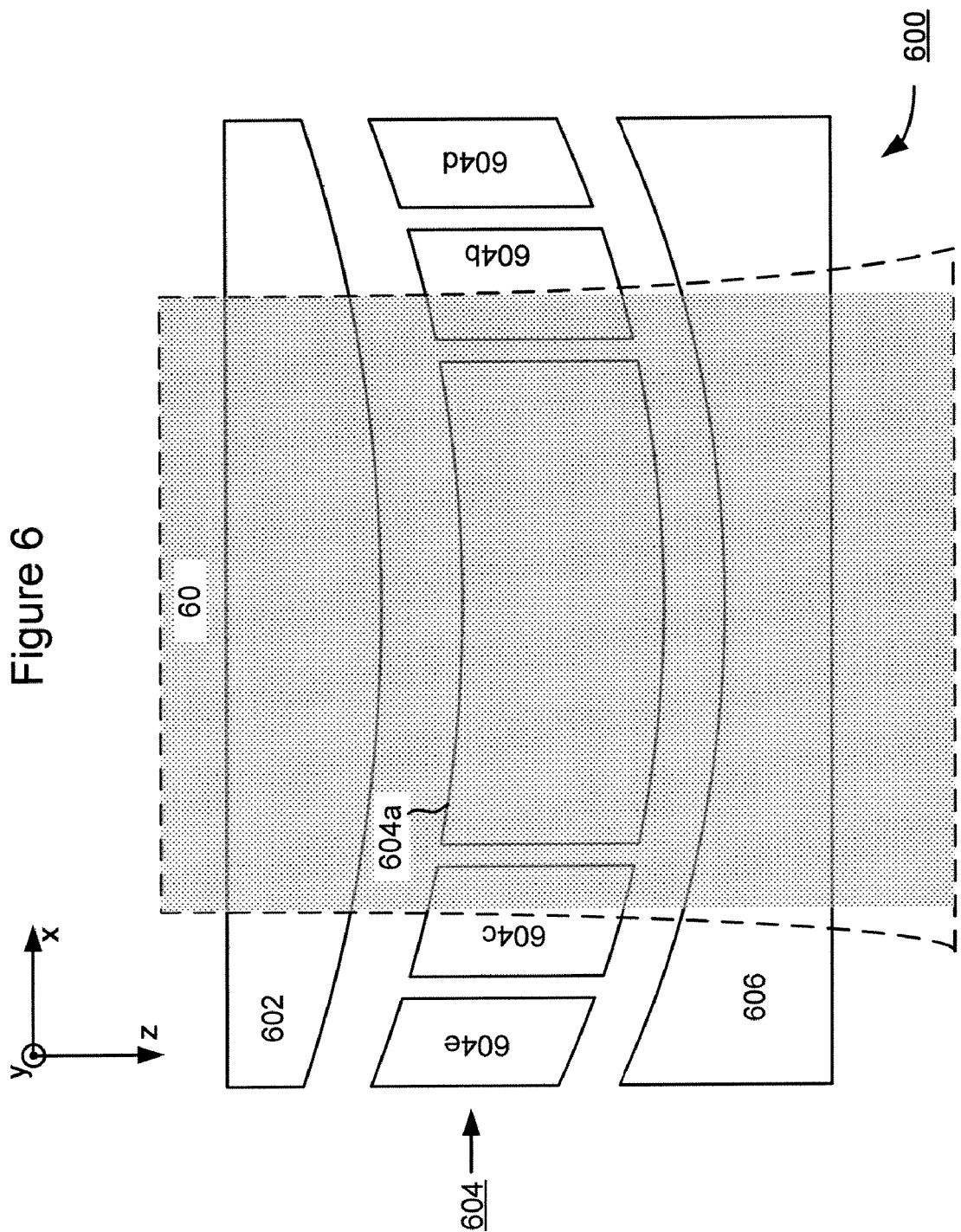
FIG. 6 shows a top view of another electrostatic lens in accordance with an embodiment of the present disclosure.

FIG. 6 shows a top view of an electrostatic lens 600 in accordance with an embodiment of the present disclosure. The electrostatic lens 600 may comprise an entrance electrode 602, a suppression electrode 604, and an exit electrode 606. Here, the suppression electrode 604 may comprise five segments: a center electrode 604a, and four side electrodes 604b, 604c, 604d, and 604e. The side electrodes may be in a same plane as the center electrode 604a. The side electrodes 604b and 604c may be positioned symmetrically with respect to the center electrode 604a. Similarly, the side electrodes 604d and 604e may be positioned symmetrically with respect to the center electrode 604a. The center electrode 604a may be biased with respect to the entrance electrode 602 to accelerate an incoming ion beam 60, and with respect to the exit electrode 606 to decelerate the ion beam 60. According to one embodiment, the side electrodes 604b and 604c may share a first voltage potential that is independent from the voltage potential on the center electrode 604a. Similarly, the side electrodes 604d and 604e may share a second voltage potential that is independent from the first voltage potential or the voltage potential on the center electrode 604a.

In both the 3-segment configuration, as shown in FIGS. 4 and 5, and the 5-segment configuration as shown in FIG. 6, actual voltage potentials applied to the independently biased electrodes may be either computationally determined based on mathematical models, or experimentally determined based on iterative adjustment of biasing voltages and measurement of angle response function(s). Alternatively, the computational and experimental methods may be combined in determining the biasing voltages. According to one embodiment, it may be desirable to keep the number of segments in the suppression electrode down in order to save computation time or tuning time.

Figure 7:
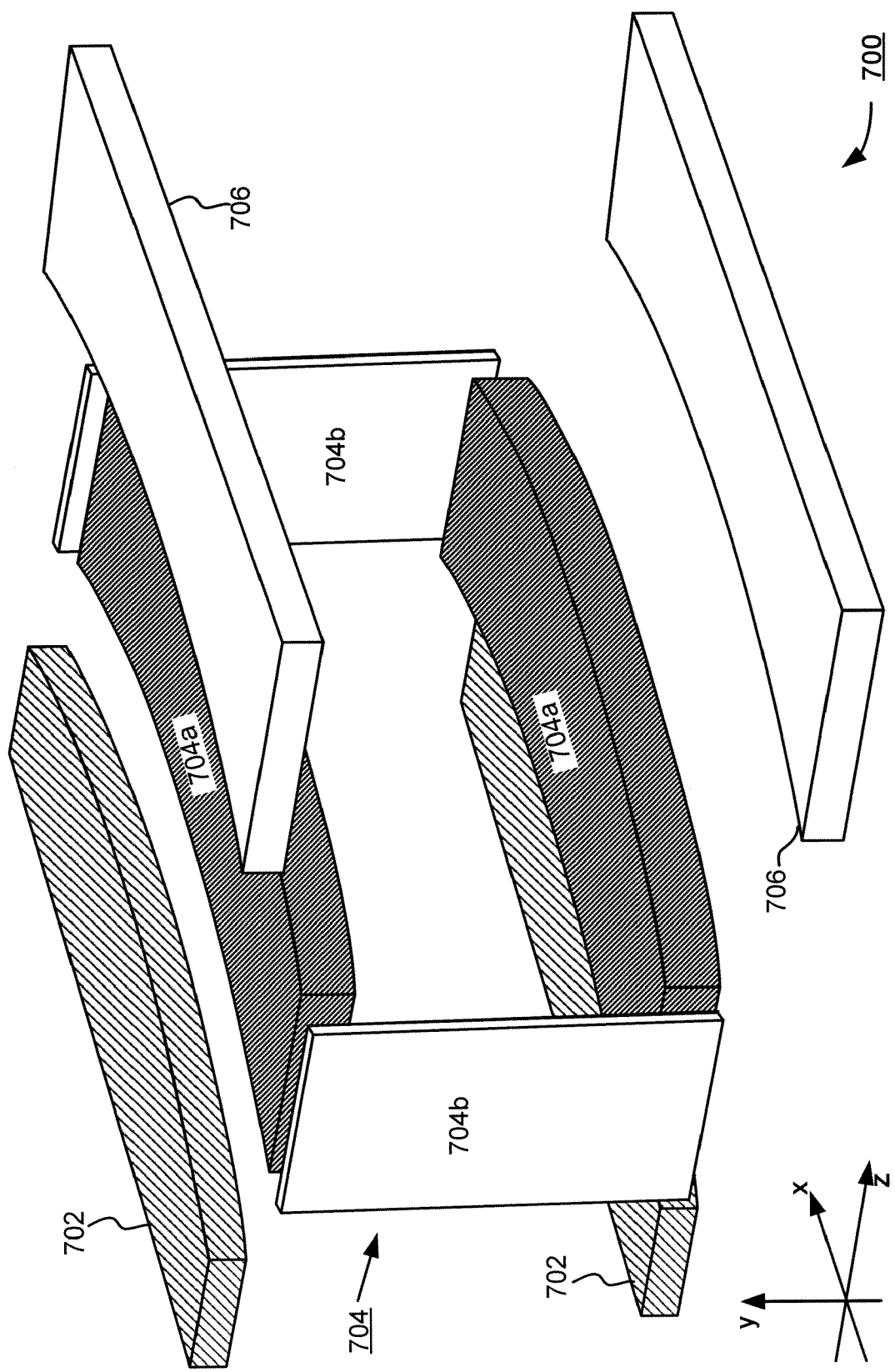
FIG. 7 shows a perspective view of yet another electrostatic lens in accordance with an embodiment of the present disclosure.

FIG. 7 shows a perspective view of an electrostatic lens 700 in accordance with an embodiment of the present disclosure. The electrostatic lens 700 may comprise an entrance electrode 702, a suppression electrode 704, and an exit electrode 706. The suppression electrode 704 may comprise center electrodes 704a and end electrodes 704b. The center electrodes 704a may be biased at a first voltage potential while the end electrodes 704b may be biased at a second voltage potential. According to one embodiment, this configuration may be used in a D2 deceleration lens such as the one shown in FIG. 1. At the D2 deceleration lens, an ion beam may be wider and taller than when it is at the D1 deceleration lens. It may be desirable to adjust both the width and divergence angle of the ion beam. The properly biased end electrodes 704b may provide the focusing forces needed to reduce the width and divergence angle of the ion beam. In addition, the end electrodes 704b may shield out unwanted electromagnetic interferences.

Figure 8:
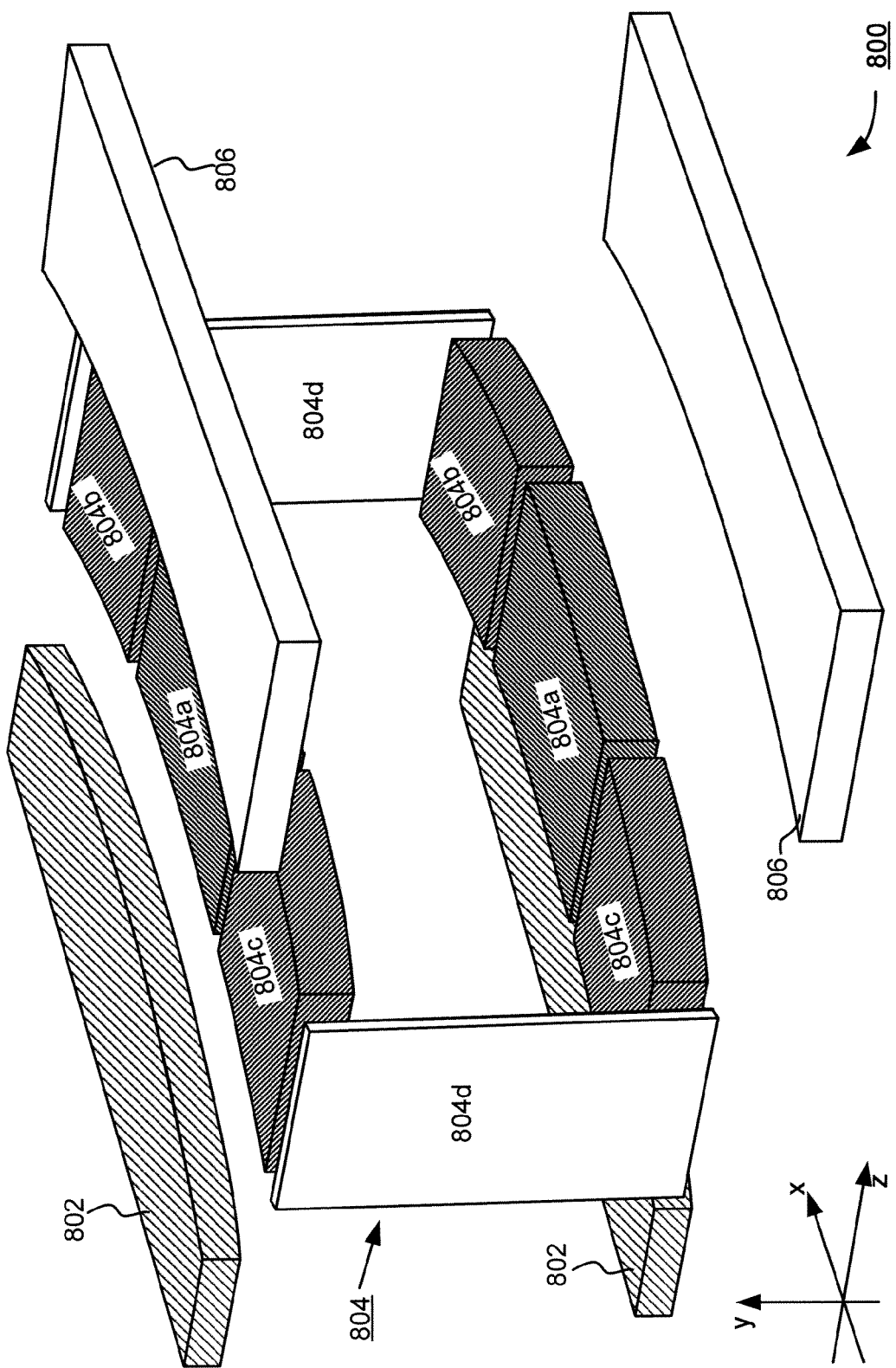
FIG. 8 shows a perspective view of still another electrostatic lens in accordance with an embodiment of the present disclosure.

FIG. 8 shows a perspective view of an electrostatic lens 800 in accordance with an embodiment of the present disclosure. The electrostatic lens 800 may comprise an entrance electrode 802, a suppression electrode 804, and an exit electrode 806. The suppression electrode 804 may comprise center electrodes 804a, side electrodes 804b and 804c, and end electrodes 804d. Compared with the electrostatic lens 700, the electrostatic lens 800 have the additional side electrodes 804b and 804c and therefore may provide more capability to shape electric fields. On the other hand, the additional side electrodes 804b and 804c may also mean additional variables to deal with.

According to further embodiments of the present disclosure, it may be advantageous to provide focusing elements along one or more edges of an ion beam. These focusing elements may be separately or independently positioned, oriented, and/or biased to help further shape the ion beam. Each focusing element may define a shaped equipotential boundary for the ion beam to correct divergence or other ion beam transport problems caused by electric field aberrations associated with traditional electrostatic lenses. The implementation of focusing elements in accordance with embodiments of the present disclosure may be especially beneficial for shaping a ribbon-shaped ion beam.

As described above, the transport of a ribbon-shaped ion beam presents significant technical challenges. It is typically required that a ribbon-shaped ion beam produce, in a wafer plane, a dose uniformity with less than 1% variations together with angular uniformity with less than 0.5 degree variations. For a low-energy (e.g., less than 1 keV) ion beam, these stringent requirements are difficult to achieve due to space charge effects. Although a deceleration procedure may be employed to improve the transport of a low-energy ion beam, traditional electrostatic deceleration lenses suffer from electric field aberrations, typically along edges of major electrodes in the lenses.

Figure 9:
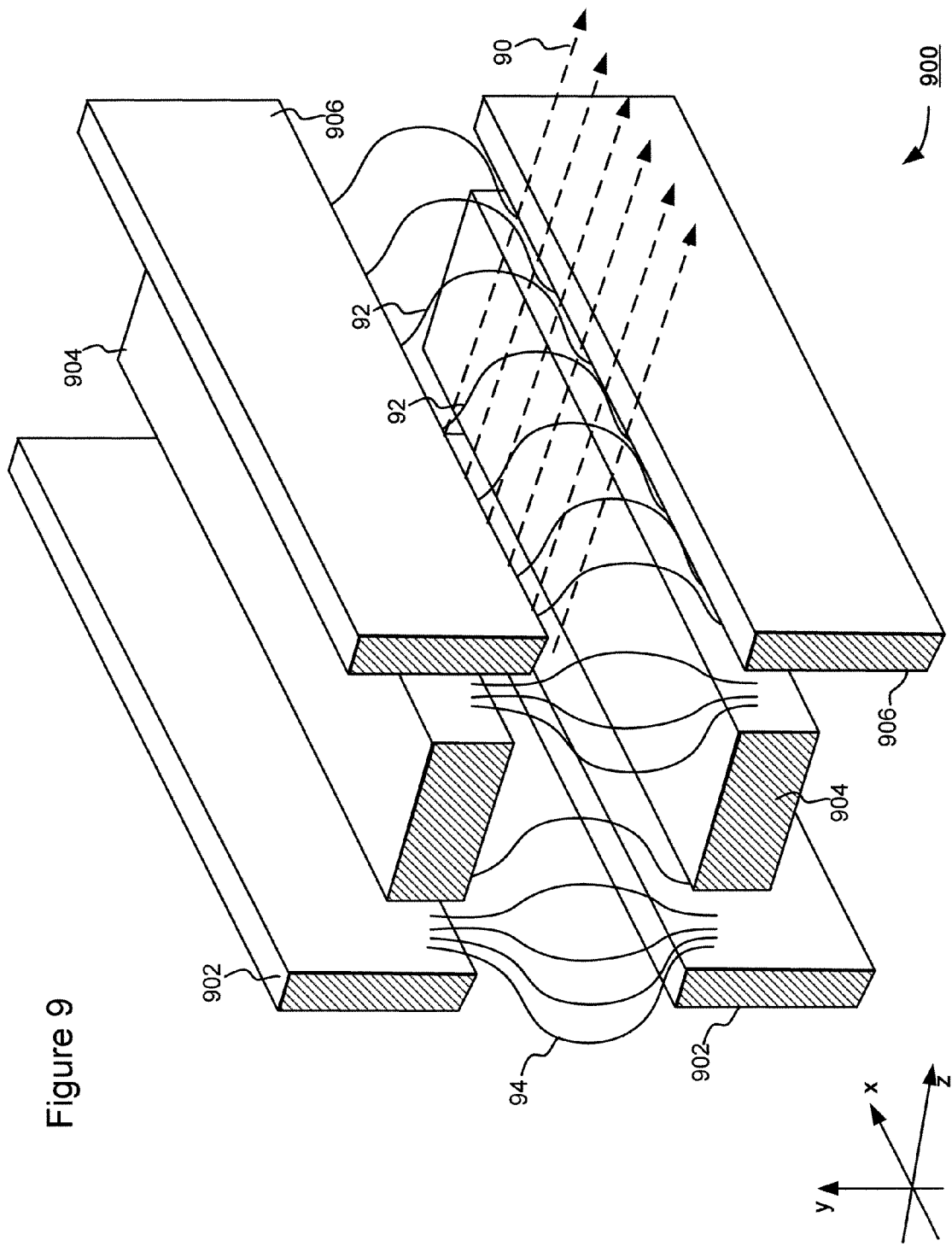
FIG. 9 shows equipotential surfaces in a prior art electrostatic triode lens.
Figure 10:
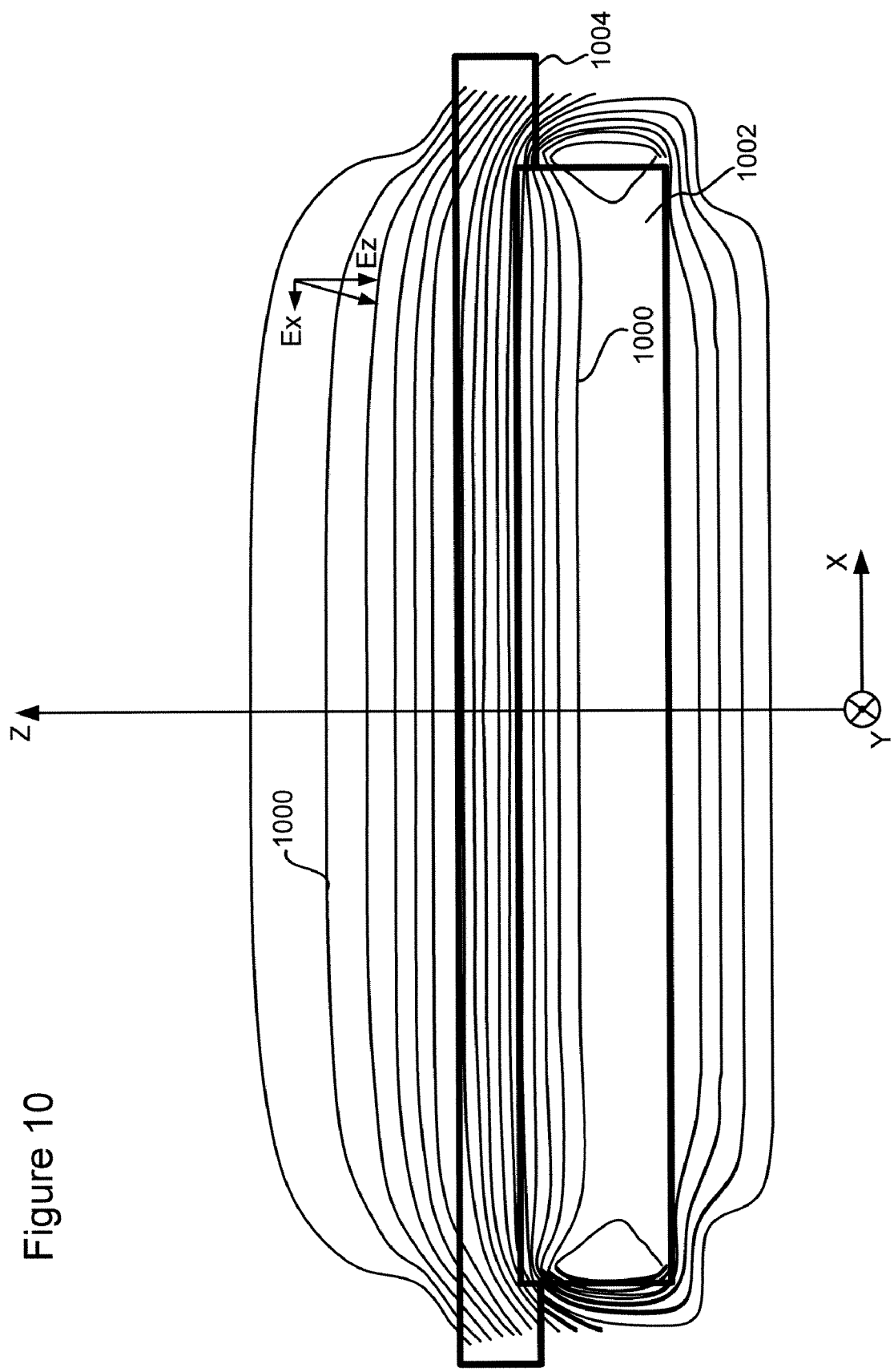
FIG. 10 shows an equipotential profile in a prior art electrostatic lens.

FIGS. 9 and 10 illustrate a typical electric field aberration problem affecting the transport of a ribbon-shaped ion beam. FIG. 9 shows equipotential surfaces in a prior art electrostatic triode lens 900. The prior art electrostatic triode lens 900 comprises entrance electrodes 902, suppression electrodes 904, and exit electrodes 906. A ribbon-shaped ion beam 90 may pass through an aperture defined by the electrodes. In a conventional setup, equipotential surfaces 92 (e.g., between the suppression electrodes 904 and the exit electrodes 906) and near the center of the ion beam 90 tend to bulge out but are essentially parallel. However, equipotential surfaces 94 along edges of the ion beam 90 may bulge out even further and may create significant electrical forces in the X directions.

FIG. 10 shows an equipotential profile in a prior art electrostatic lens having two electrodes 1002 and 1004. Equipotential lines 1000 are shown for the electrodes 1002 and 1004. Near the center of the electrodes 1002 and 1004 (along the Z axis), the equipotential lines 1000 are parallel to one another, producing no electric field component in the X direction. However, as one gets closer to the edges of the electrodes 1002 and 1004, the X component of the electric field (Ex) becomes more and more significant with respect to the Z component (Ez). The X component of the electric field tends to aggravate the space charge effects on a ribbon-shaped ion beam and may cause parallelism problems as well as uniformity problems in the ion beam.

To overcome the above-described electric field aberrations in an electrostatic lens, it may be desirable to introduce one or more focusing elements along edges of an ion beam, wherein each focusing element may be individually configured to define a properly shaped equipotential boundary for the ion beam.

Figure 11:
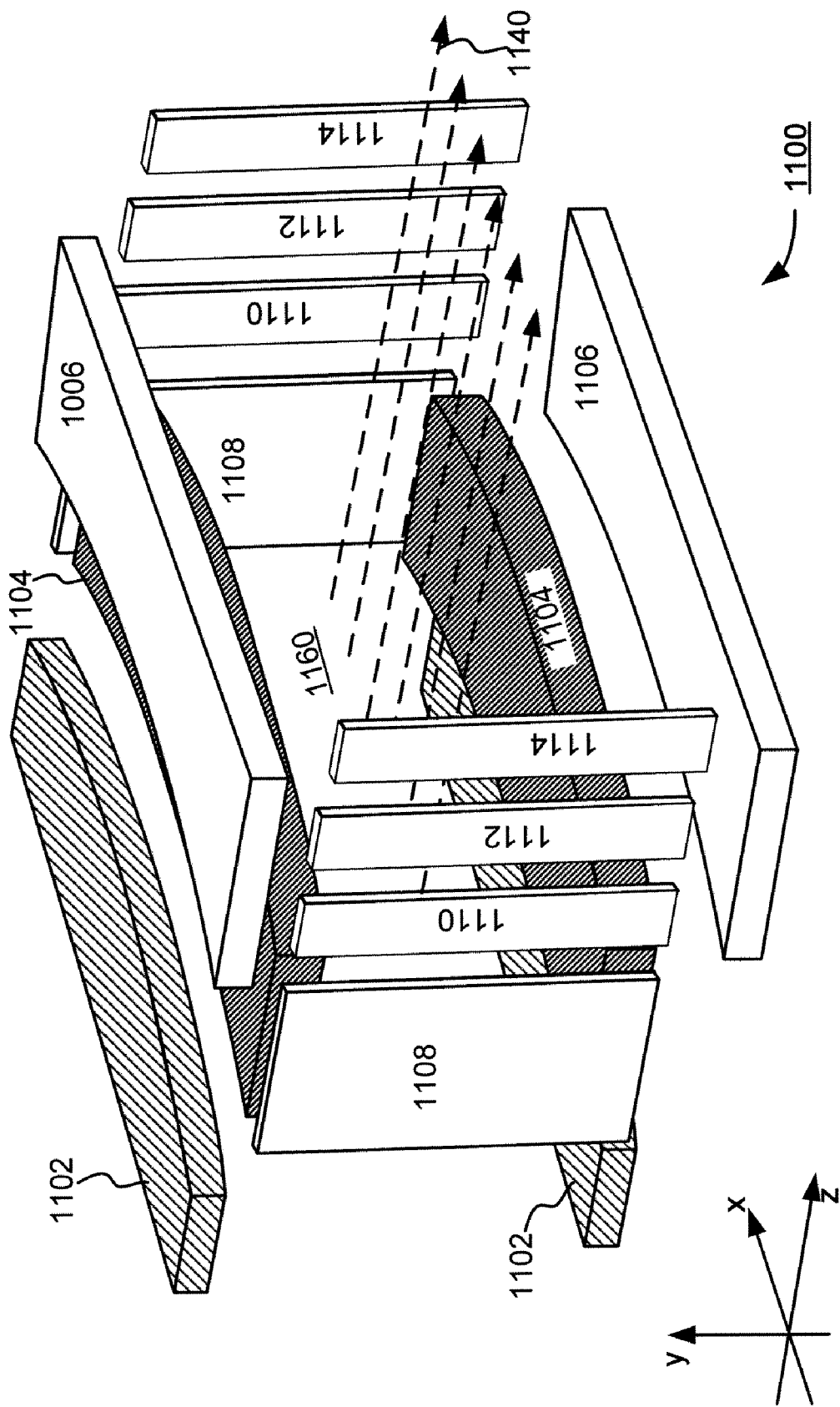
FIG. 11 shows an exemplary electrostatic triode lens with a plurality of focusing elements in accordance with an embodiment of the present disclosure.

FIG. 11 shows an exemplary electrostatic triode lens 1100 with a plurality of focusing elements in accordance with an embodiment of the present disclosure. The electrostatic triode lens 1100 may comprise entrance electrodes 1102, suppression electrodes 1104, and exit electrodes 1106. These electrodes may define a substantially rectangular aperture 1160 through which a ribbon-shaped ion beam 1140 may pass through. Along short edges of the aperture 1160, one or more focusing elements (e.g., 1108, 1110 and 1112) may be positioned, typically extending in the direction of ion beam propagation. Although three pairs of focusing elements 1108, 1110 and 1112 are shown here for illustration purposes, the number, sizes, shapes, positioning, and/or orientation of the focusing elements may be significantly varied depending on specific beam shaping needs. In addition, each focusing element may be separately biased, such that its electrical potential, coupled with its physical features (e.g., size, shape, position and/or orientation), may produce a shaped equipotential boundary facing the ion beam 1140. One or more such shaped equipotential boundaries may collectively shape the ion beam 1140 as needed.

According to embodiments of the present disclosure, the electrical bias applied to each element, as well as one or more of its physical features, may be adjusted to achieve a desired equipotential boundary. For example, a focusing element may be made from a flexible metal sheet such that a surface or edge curvature may be adjusted to some extent. A relative distance between two focusing elements may be adjusted. A focusing element may be moved closer to or farther away from the ion beam 1140 (i.e., in the X directions), along the beam propagation direction (i.e., in the Z directions), or perpendicular to the beam plane (i.e., in the Y directions). A focusing element may also be rotated or tilted for a different orientation with respect to the ion beam 1140. Adjustment of some or all the physical features associated with the focusing elements may require mechanical actuation. However, the description above does not preclude the use of focusing elements with fixed physical features.

As will be appreciated by those skilled in the art, the concept of using multiple focusing elements to provide individually shaped equipotential boundaries may lead to endless variations in the choice and configuration of focusing elements. FIGS. 12-15 present just a few exemplary options for implementing focusing elements to shape ribbon beams. In these drawings, for illustrative convenience, only one set of main electrodes (i.e., 1202, 1302, 1402 and 1502) are shown. It should also be noted that the single set of main electrodes are not necessarily suppression electrodes in a triode lens. Instead, the focusing elements may be implemented with any electrode component in an electrostatic lens. For example, a pair of focusing elements may be configured as part of a set of ground electrodes to help shape an ion beam as it passes near the ground electrodes.

Figure 12:
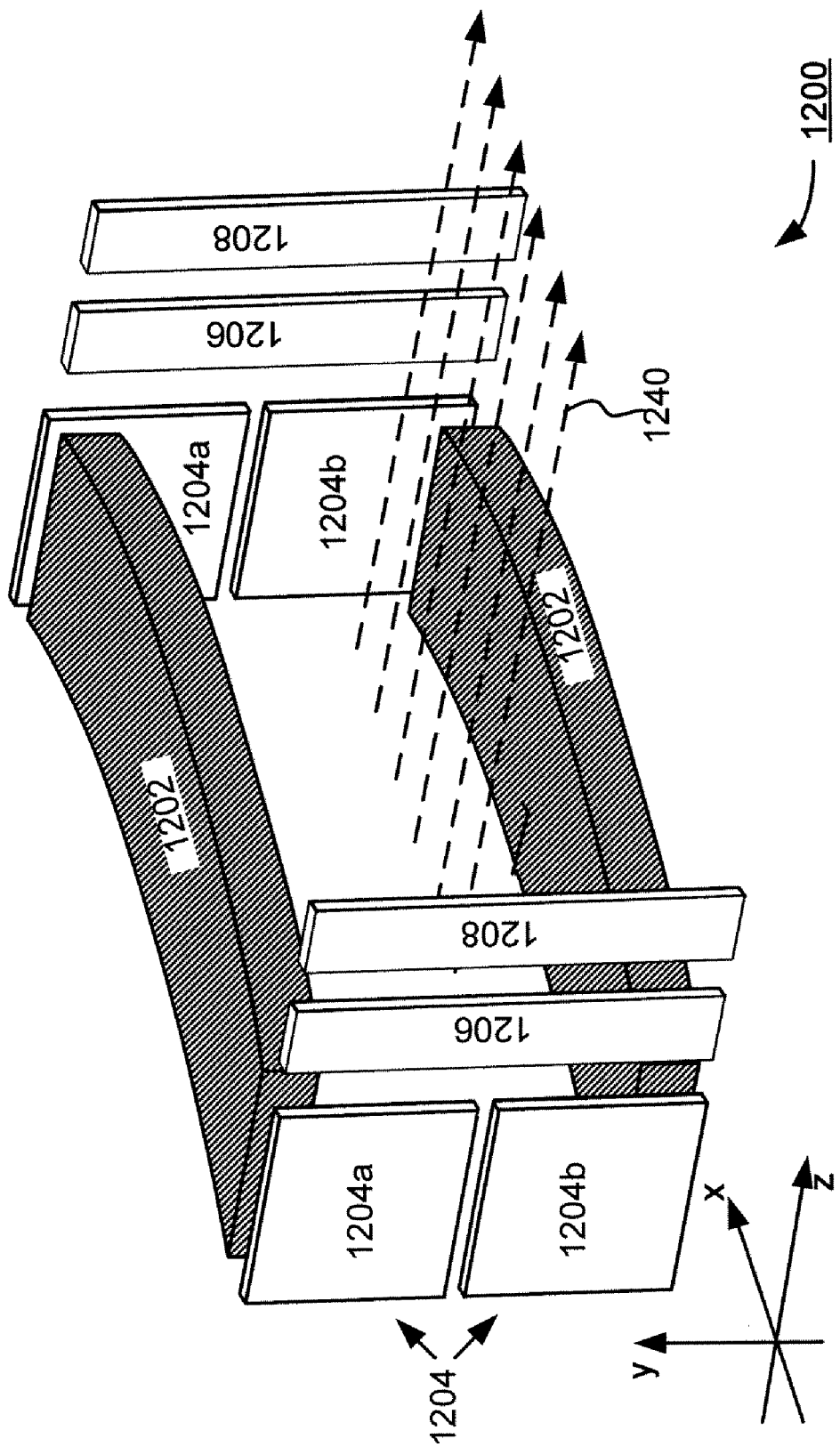
FIG. 12 shows another exemplary electrostatic lens with a plurality of focusing elements in accordance with an embodiment of the present disclosure.

FIG. 12 shows an exemplary electrostatic lens 1200 with a plurality of focusing elements in accordance with an embodiment of the present disclosure. The electrostatic lens 1200 may comprise a set of main electrodes 1202 through which a ribbon-shaped ion beam 1240 may pass. Along edges of the ion beam 1240, a few pairs of focusing elements 1204, 1206, and 1208 may be provided. The focusing elements 1204 may be further segmented into 1204a and 1204b, wherein each segment may be separately oriented and biased to produce more refined equipotential boundaries than a non-segmented pair of focusing elements.

Figure 13:
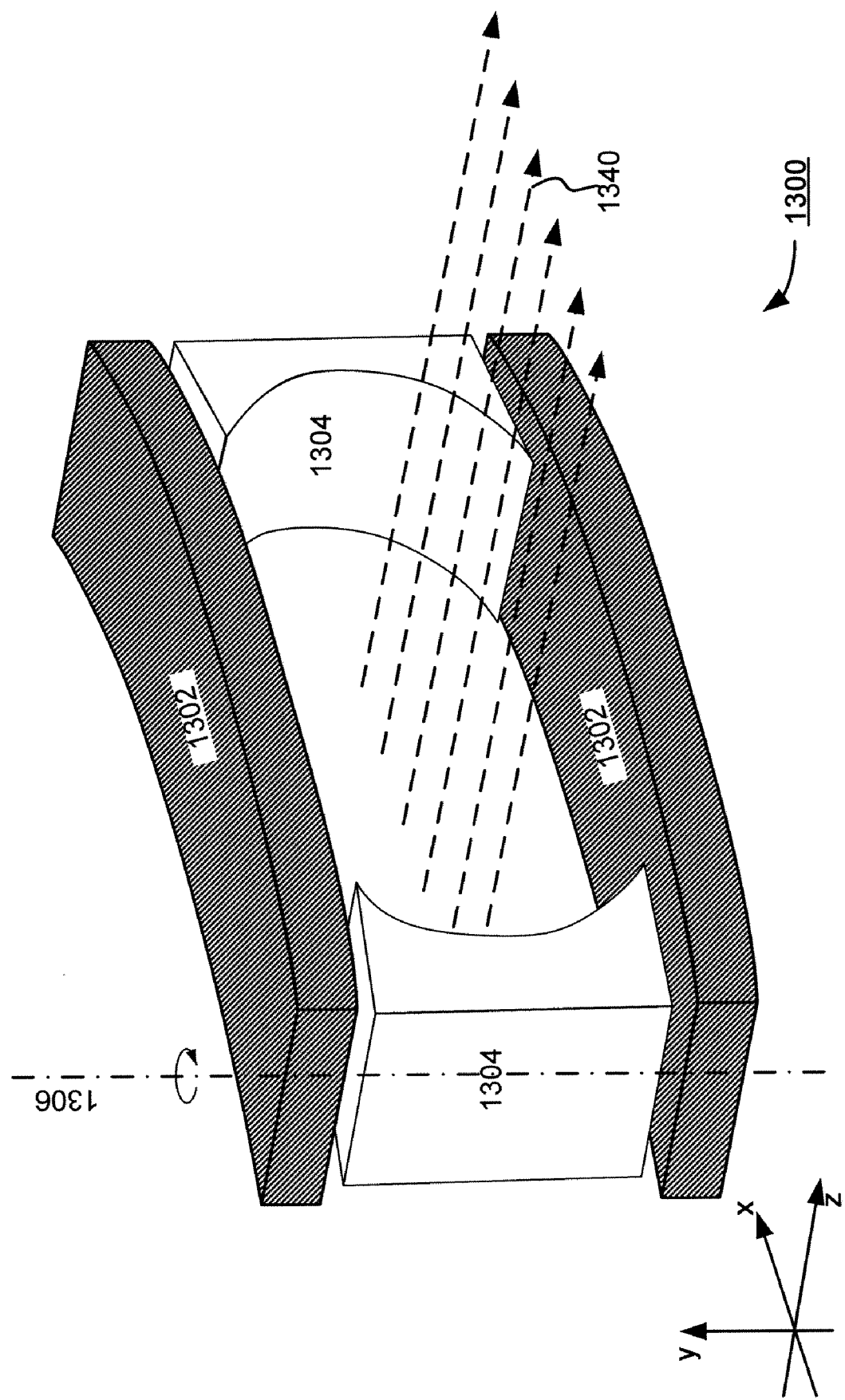
FIG. 13 shows an exemplary electrostatic lens with a pair of elliptical focusing elements in accordance with an embodiment of the present disclosure.

FIG. 13 shows an exemplary electrostatic lens 1300 with a pair of elliptical focusing elements 1304 in accordance with an embodiment of the present disclosure. The focusing elements 1304 may be positioned between a set of main electrodes 1302 and along either side of a ribbon-shaped ion beam 1340. Each focusing element 1304 may have an elliptical surface (or a surface with a similar or other defined contour) that faces the ion beam 1340. The elliptical surfaces may accommodate equipotential surfaces that bulge outwards between the main electrodes 1302 without introducing unwanted perturbations to the electric field. The position or orientation of the focusing elements 1304 are not limited to what is shown in FIG. 13. For example, the focusing elements 1304 may be positioned or moved further downstream along the path of the ion beam 1340 (i.e., +Z direction). According to one embodiment, either or both of the focusing elements 1340 may be hinged so that they may rotate around a vertical axis 1306, thereby changing the effective curvature of an equipotential boundary that faces the ion beam 1340.

Figure 14:
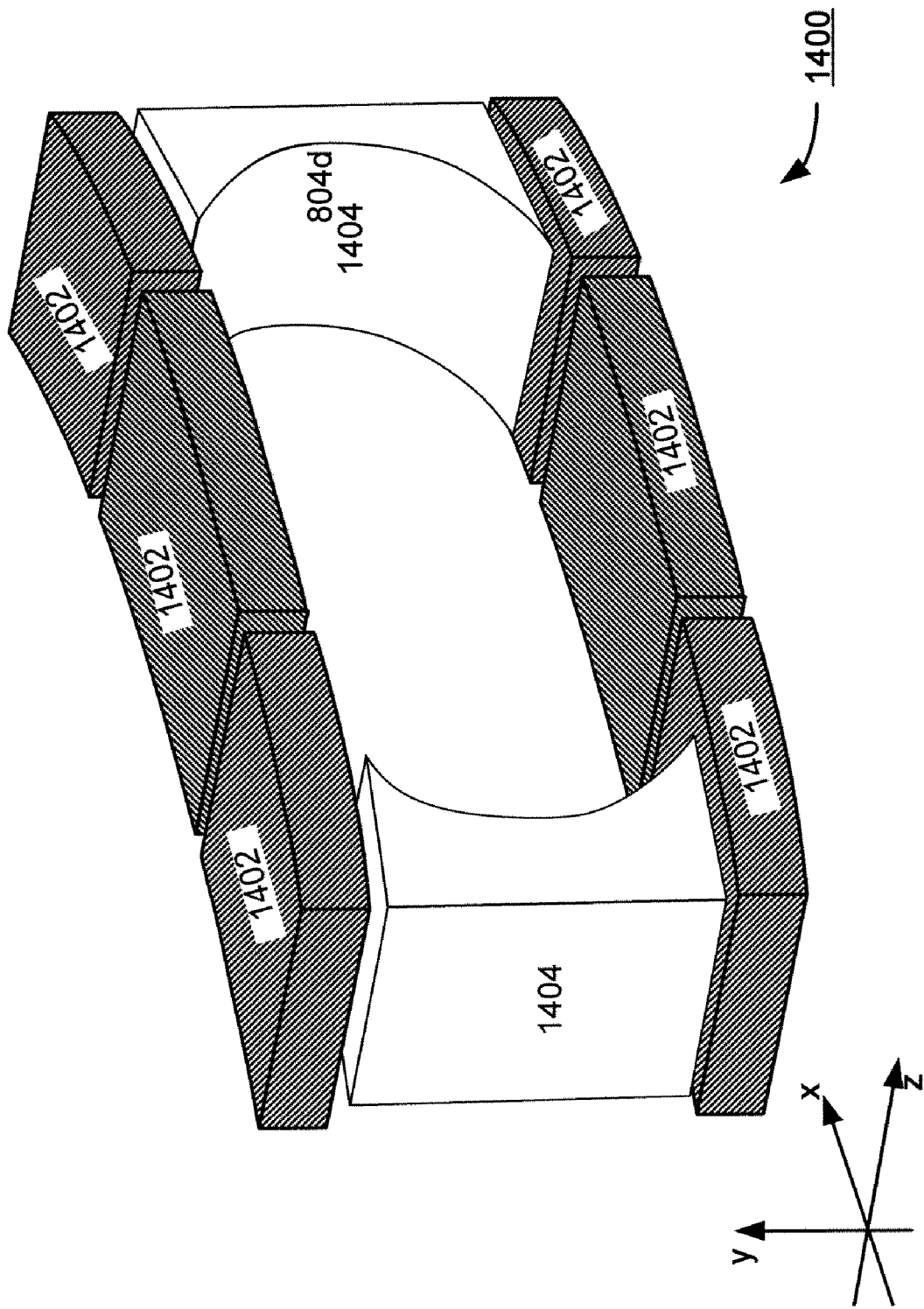
FIG. 14 shows an exemplary electrostatic lens with a segmented suppression electrode and a pair of elliptical focusing elements in accordance with an embodiment of the present disclosure.

FIG. 14 shows an exemplary electrostatic lens 1400 with a segmented suppression electrode 1402 and a pair of elliptical focusing elements 1404 in accordance with an embodiment of the present disclosure. That is, the focusing elements 1404 may be implemented together with the above-described technique for a segmented suppression electrode. The focusing elements 1404 may provide shaped equipotential boundaries primarily for end sections of an ion beam (not shown). The individually biased segments in the suppression electrode 1402 may not only provide the main deceleration potential for the ion beam, but may smooth out transition of the electric field from the center portion to the edges of the ion beam.

Figure 15:
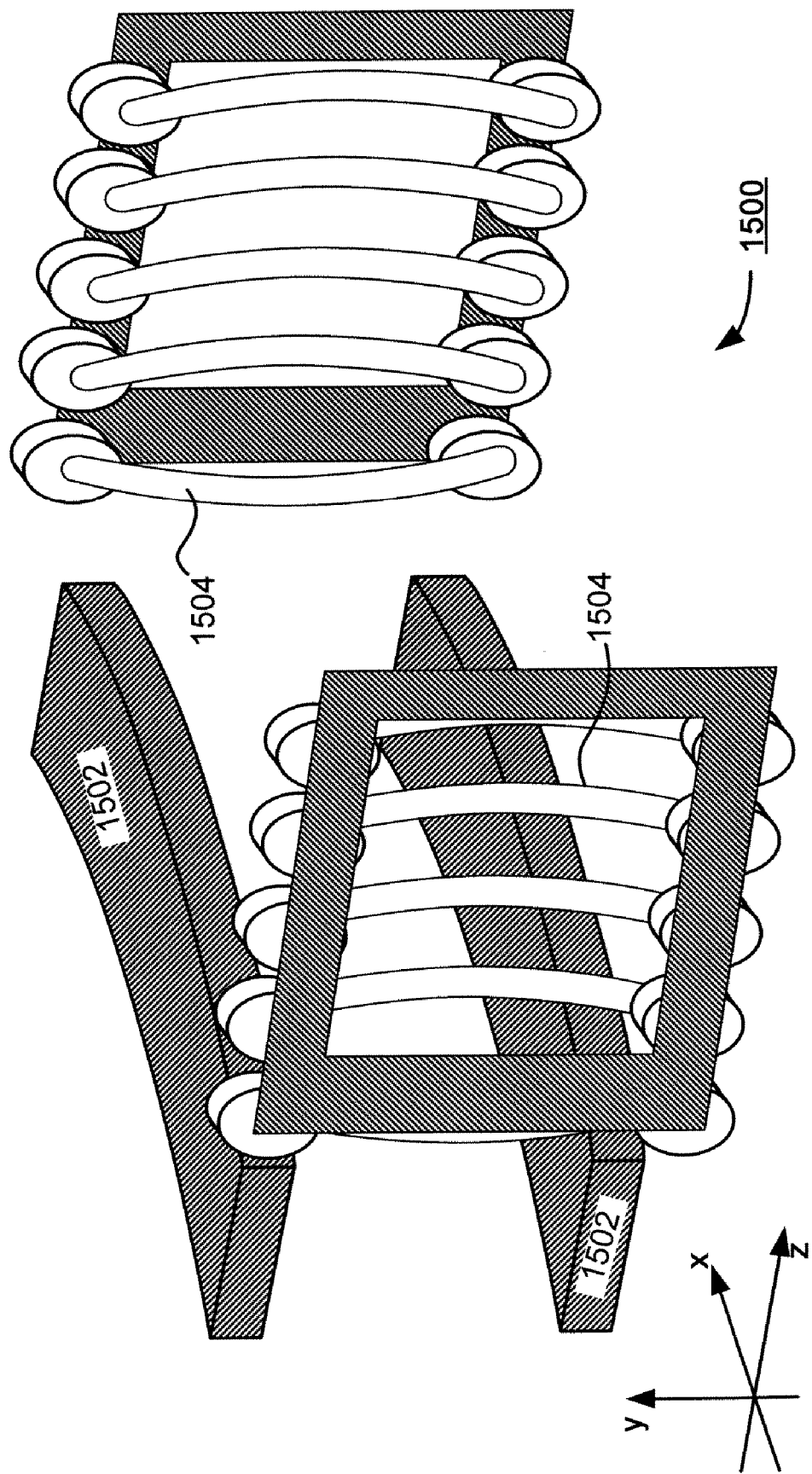
FIG. 15 shows another exemplary electrostatic lens with a plurality of focusing elements in accordance with an embodiment of the present disclosure.

FIG. 15 shows another exemplary electrostatic lens 1500 with a plurality of focusing elements 1504 in accordance with an embodiment of the present disclosure. Each focusing element 1504 may be a curved bar positioned along short edges of a ribbon-shaped ion beam (not shown). As shown, an array of the curved focusing elements 1504 may be arranged along the Z direction. The individually biased focusing elements 1504 may cause a decelerated ribbon beam to behaving as though a deceleration electric field were infinite in length in both positive and negative X directions.

At this point it should be noted that the technique for shaping a ribbon-shaped ion beam in accordance with the present disclosure as described above typically involves the processing of input data and the generation of output data to some extent. This input data processing and output data generation may be implemented in hardware or software. For example, specific electronic components may be employed in an ion implanter or similar or related circuitry for implementing the functions associated with ribbon beam end termination in accordance with the present disclosure as described above. Alternatively, one or more processors operating in accordance with stored instructions may implement the functions associated with ribbon beam end termination in accordance with the present disclosure as described above. If such is the case, it is within the scope of the present disclosure that such instructions may be stored on one or more processor readable carriers (e.g., a magnetic disk), or transmitted to one or more processors via one or more signals.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. An apparatus for shaping a ribbon-shaped ion beam, the apparatus comprising:
an electrostatic lens having a substantially rectangular aperture for a ribbon-shaped ion beam to pass through, wherein an electrode of the electrostatic lens is positioned along long edges of the aperture, wherein a plurality of focusing elements of the electrostatic lens are positioned along short edges of the aperture, wherein the electrode is biased, and wherein each focusing element is separately biased and oriented to shape the ribbon-shaped ion beam.

2. The apparatus according to claim 1, wherein at least one focusing element has a curved surface that defines a correspondingly shaped equipotential boundary for the ribbon-shaped ion beam.

3. The apparatus according to claim 2, wherein the at least one focusing element has an elliptical surface.

4. The apparatus according to claim 1, wherein at least one focusing element has a curved edge that defines an equipotential boundary for the ribbon-shaped ion beam.

5. The apparatus according to claim 1, wherein at least one focusing element can be rotated to change a shape of an equipotential boundary for the ribbon-shaped ion beam.

6. The apparatus according to claim 1, wherein the electrostatic lens further comprises a plurality of electrodes, and wherein a distance between at least one focusing element and at least one of the plurality of electrodes is adjustable.

7. The apparatus according to claim 1, wherein a distance between at least one focusing element and the aperture is adjustable.

8. The apparatus according to claim 1, wherein a separation among the plurality of focusing elements is adjustable.

9. The apparatus according to claim 1, wherein the plurality of focusing elements comprise a pair of focusing elements that form an oval-shaped aperture.

10. A method for shaping a ribbon-shaped ion beam, the method comprising the steps of:
    providing an electrostatic lens having a substantially rectangular aperture for a ribbon-shaped ion beam to pass through;
    positioning an electrode of the electrostatic lens along long edges of the ribbon-shaped ion beam;
    positioning a plurality of focusing elements of the electrostatic lens along short edges of the ribbon-shaped ion beam;
    biasing the electrode; and
    biasing and orienting each focusing element separately to shape the ribbon-shaped ion beam.

11. The method according to claim 10, wherein at least one focusing element has a curved surface that defines a correspondingly shaped equipotential boundary for the ribbon-shaped ion beam.

12. The method according to claim 11, wherein the at least one focusing element has an elliptical surface.

13. The method according to claim 10, wherein at least one focusing element has a curved edge that defines an equipotential boundary for the ribbon-shaped ion beam.

14. The method according to claim 10, further comprising: rotating at least one focusing element to change a shape of an equipotential boundary for the ribbon-shaped ion beam.

15. The method according to claim 10, further comprising: providing a plurality of electrodes in the electrostatic lens; and adjusting a distance between at least one focusing element and at least one of the plurality of electrodes.

16. The method according to claim 10, further comprising: adjusting a distance between at least one focusing element and the aperture.

17. The method according to claim 10, further comprising: adjusting a separation among the plurality of focusing elements.

18. The method according to claim 10, wherein the plurality of focusing elements comprise a pair of focusing elements that form an oval-shaped aperture.

19. At least one processor readable carrier for storing a computer program of instructions configured to be readable by at least one processor for instructing the at least one processor to execute a computer process for performing the method as recited in claim 10.

20. A method for shaping a ribbon-shaped ion beam, the method comprising the steps of:
    positioning a plurality of focusing elements along short edges of a substantially rectangular aperture in an electrostatic lens;
    positioning an electrode along long edges of a substantially rectangular aperture in the electrostatic lens;
    biasing the electrode;
    biasing and orienting each focusing element separately to define shaped equipotential boundaries; and
    passing a ribbon-shaped ion beam through the aperture.

* * * * *